(12) United States Patent
Ishida et al.

(10) Patent No.: US 6,246,605 B1
(45) Date of Patent: Jun. 12, 2001

(54) STATIC RAM WITH IMPROVED MEMORY CELL PATTERN

(75) Inventors: Minoru Ishida, Kanagawa; Yutaka Okamoto, Tokyo, both of (JP)

(73) Assignee: Sony Corporation, Tokyo (JP)

( * ) Notice: Subject to any disclaimer, the term of this patent is extended or adjusted under 35 U.S.C. 154(b) by 1361 days.

(21) Appl. No.: 08/509,638

(22) Filed: Jul. 31, 1995

Related U.S. Application Data (63) Continuation of application No. 08/147,555, filed on Nov. 5, 1993, now abandoned.

(30) Foreign Application Priority Data

Nov. 6, 1992 (JP) .................................................. 04-322348

(51) Int. Cl.$^7$ ..................................................... G11C 11/00
(52) U.S. Cl. ............................................ 365/154; 365/156
(58) Field of Search .................................... 365/154, 156, 365/95, 182; 257/391, 392, 393, 903

(56) References Cited

U.S. PATENT DOCUMENTS

| | | | |
|---|---|---|---|
| 4,396,996 | * 8/1983 | Oldham | 365/95 |
| 4,570,237 | * 2/1986 | Nagayoshi | 365/95 |
| 4,833,644 | * 5/1989 | Plus | 365/154 |
| 4,841,481 | * 6/1989 | Ikeda | 365/154 |
| 5,018,102 | * 5/1991 | Houston | 365/95 |
| 5,241,204 | * 8/1993 | Kayama | 257/368 |
| 5,438,537 | * 8/1995 | Sasaki | 257/903 |

* cited by examiner

*Primary Examiner*—A. Zarabian
(74) *Attorney, Agent, or Firm*—Sonnenschein, Nath & Rosenthal

(57) ABSTRACT

A split word type static RAM 1 with TFT load elements has improved resistance to soft errors and has more reliable wiring for a bit line. In this static RAM 1, the structures for patterns for first and second driver transistors 17 and 18, and the structures for patterns for first and second word transistors 15 and 16 are respectively arranged symmetrically about a central point 0, and the structures for patterns for first and second TFTs 19 and 20 are arranged asymmetrically. The channel region 31 of the first TFT 19 is made long, on one part of which a capacitor is formed. A bit contact extends upwardly over a word transistor and is connected with a bit line.

13 Claims, 8 Drawing Sheets

(PRIOR ART)

STATIC RAM WITH IMPROVED MEMORY CELL PATTERN

This is a continuation of application Ser. No. 08/147,555 filed Nov. 5, 1993, abandoned Sep. 13, 1995.

BACKGROUND OF THE INVENTION

1. Field of the Invention

The present invention relates to a static RAM, and more particularly to a split word line type static RAM with thin film transistor (TFT) load elements.

2. Description of the Related Art

Figure 7:
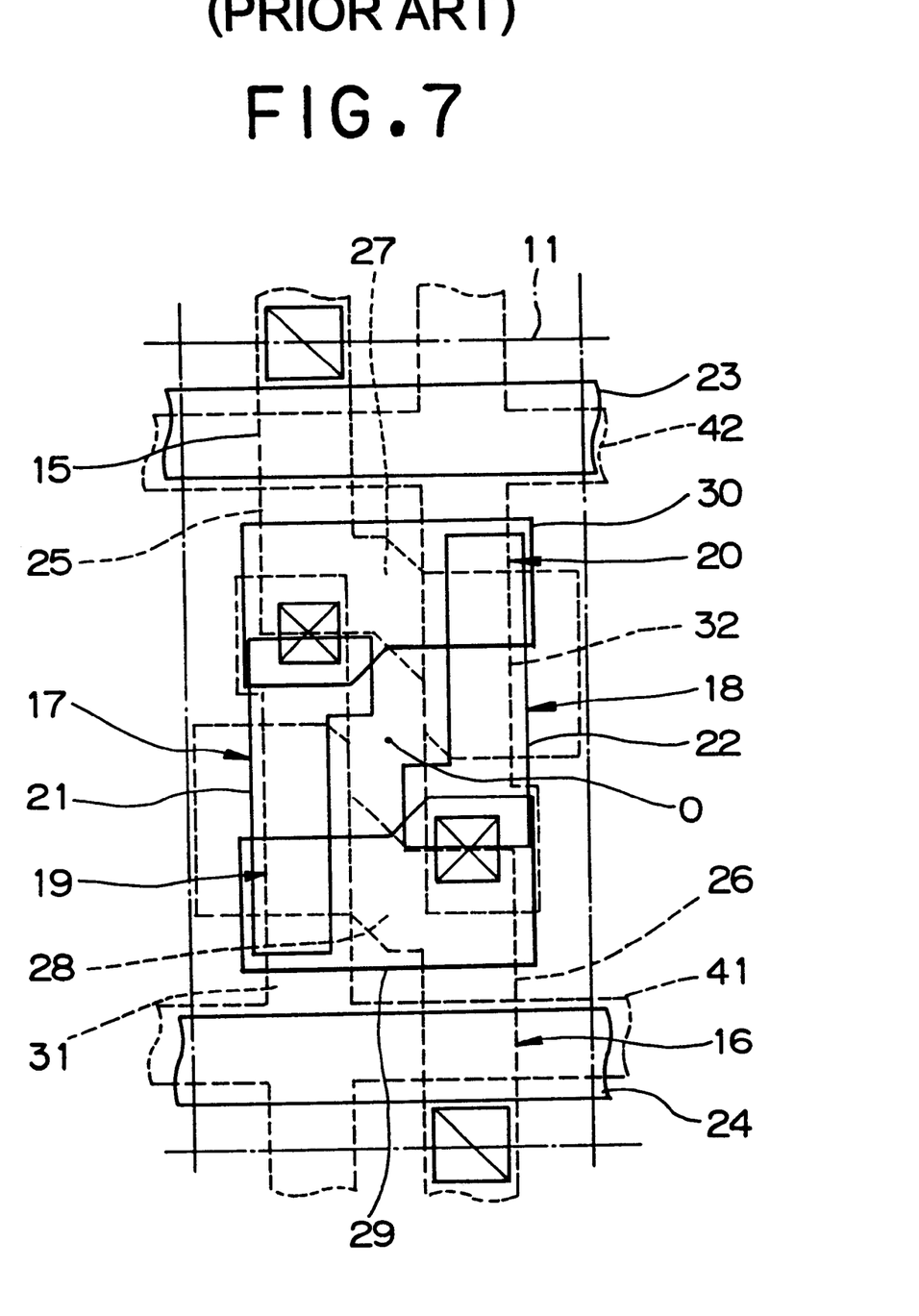
FIG. 7 is a layout diagram for a conventional example.
Figure 8:
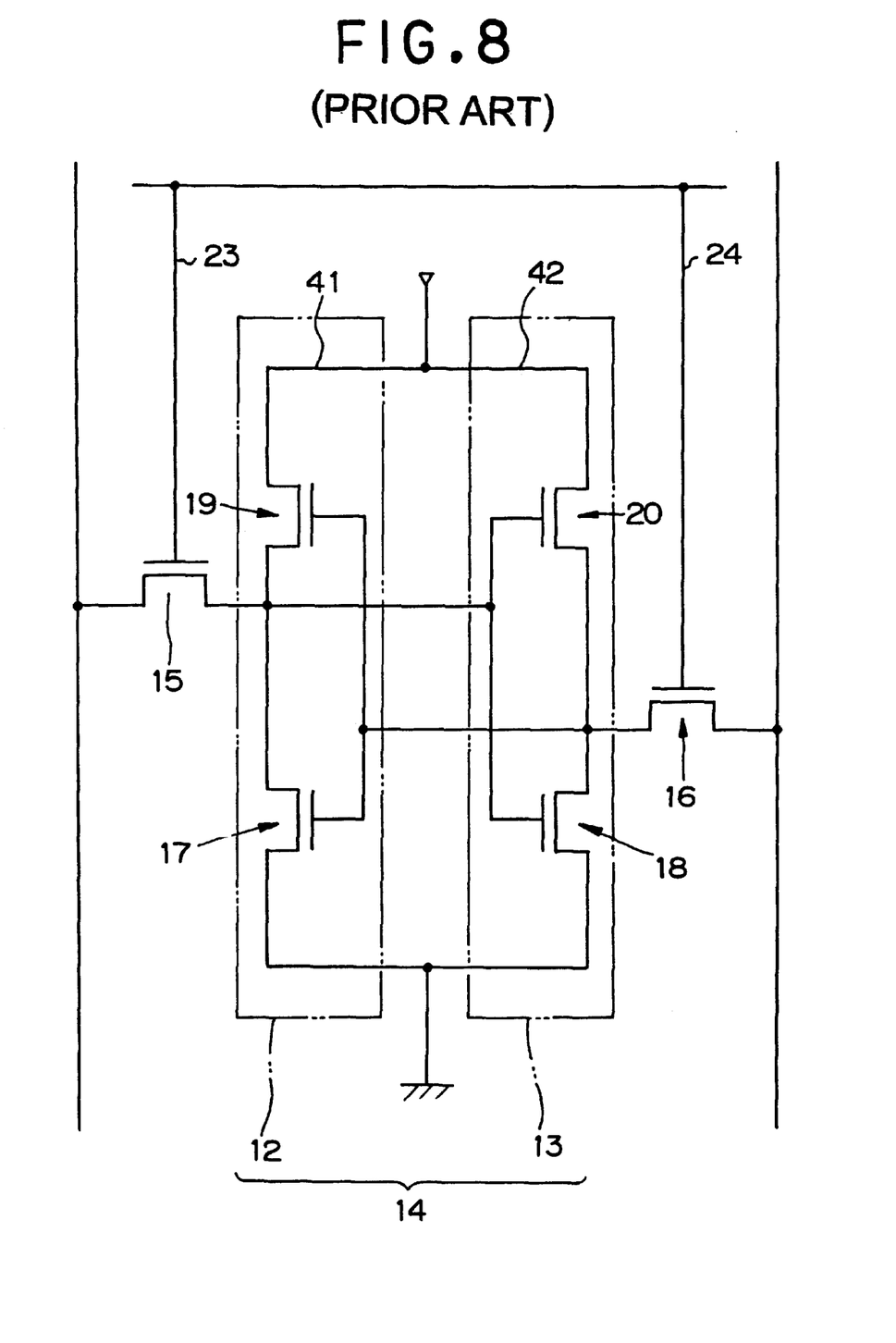
FIG. 8 is a circuit diagram of an example of the prior art.

Memory cells for conventional static type RAMs will now be described with reference to the layout diagram in FIG. 7 and the circuit diagram in FIG. 8.

As is shown in the diagram, a flip-flop 14 is formed within a memory cell 11 from a first inverter 12 and a second inverter 13. A first word transistor 15 and a second word transistor 16 are then connected to this flip-flop.

A gate electrode 21 for a first driver transistor 17 constructed in the first inverter 12 and a gate electrode 22 for a second driver transistor 18 constructed in the second inverter 13 are arranged point symmetrically about a point O. A word line 23 including the gate electrode for the for the first word transistor 15 and a word line 24 including the gate electrode for the second word transistor 16 are also arranged symmetrically about the same point 0. In addition to this, the diffusion layer regions 25 and 26 for the first and second word transistors 15 and 16 and the diffusion layer regions 27 and 28 for the respective first and second driver transistors 17 and 18 which regions 27 and 28 are connected to the regions 25 and 26, respectively, are also arranged symmetrically about the same point 0.

Also, a gate terminal 29 for the first load element 19 (as this load element is a TFT, it will herein be referred to as the first TFT) within the first inverter 12 and a gate electrode 30 for the second load element 20 (as this load element is also made from TFT, it will herein be referred to as the second TFT) within the second inverter 13 are also arranged point symmetrically about this point 0 within the region for the same memory cell 11.

Further, a channel region 31 of the first TFT 19, a channel wiring 41 which is connected to the channel region 31, a channel region 32 for the second TFT 20, and the separate channel wiring 42 which is connected to the channel region 32 are arranged so as to be symmetrical about the central point 0. In addition, the channel wiring 41 is laid on the word line 24, whereas the other channel wiring 42 is laid on the word line 23.

Figure 9:
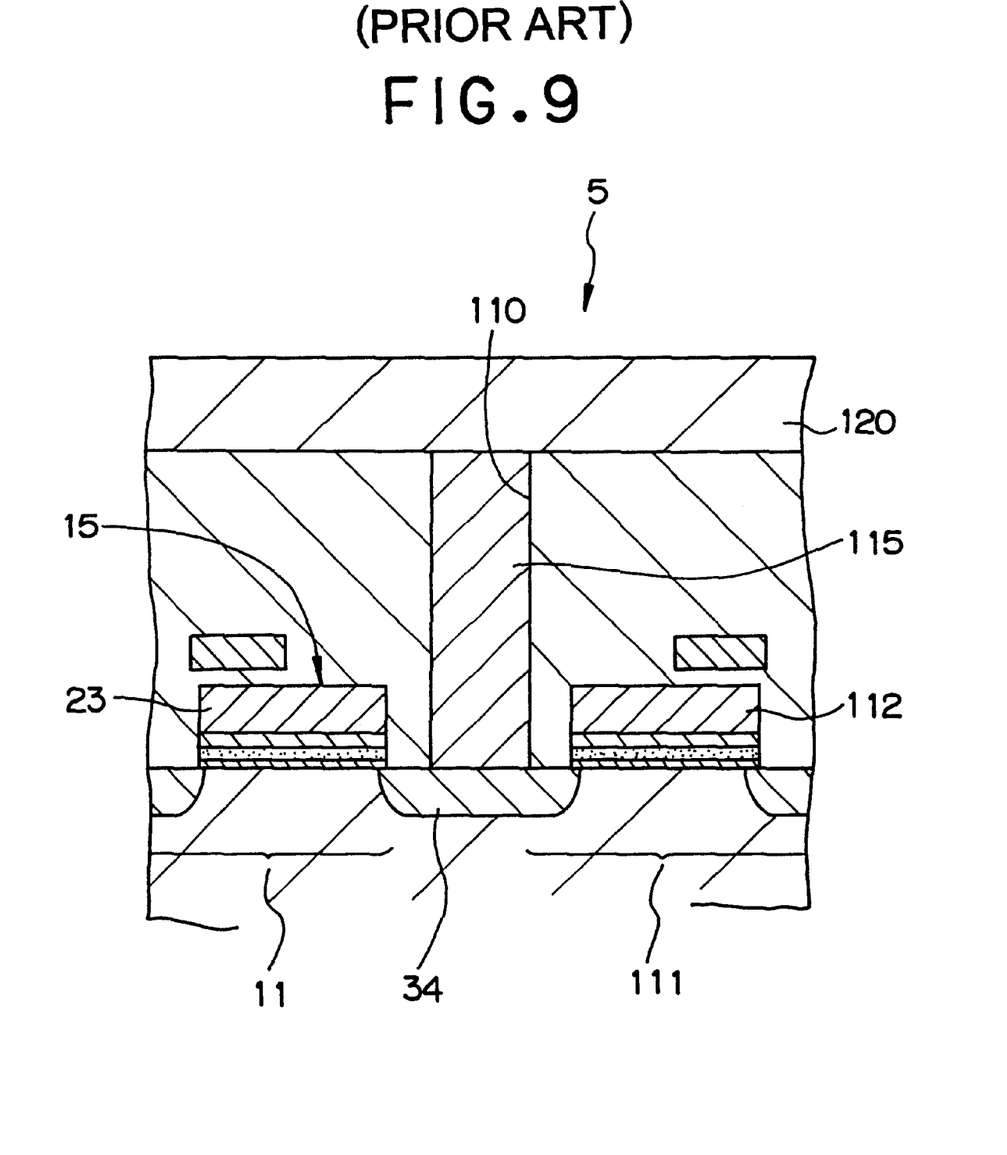
FIG. 9 is a schematic cross-sectional view showing a bit contact part for a conventional example.

As is shown in a schematic cross-sectional diagram in FIG. 9, in the split word line type static RAM 5 with TFT load elements there is a contact hole 110 used for bit contact which, in addition to being in between the memory cells 11 and 111, is also in between the first word line 23 for the memory cell 11 and a second word line 112 for the memory cell 111. A bit line 120 is then connected to the diffusion layer 34 of the first word transistor 15 via a plug 115 which is formed in the contact hole 110.

However, with static RAMs having the above structure, there are two pieces of channel wiring connected within one memory cell region. As a result, it is not possible to secure a region for forming a capacitor (cross coupled capacitor) with the polysilicon film which makes up the gate electrode of the TFT and the polysilicon layer which makes up the channel region of the same TFT as a counter measure against soft errors, which makes the forming of such a capacitor very difficult.

If such a capacitor having a sufficient capacity is to be formed, additional layers have to be formed to make up this capacitor.

Also, with the connection of the diffusion layer of the word transistor and the bit line in the above structure, the aspect ratio for the contact hole usually becomes large since the contact hole is formed by self-alignment with a stepped portion in the first layer polysilicon film forming the first and second word lines. It is then very difficult to embed and form the bit line with a good coverage into the contact hole. The reliability of the wiring for the bit line would be therefore degraded.

SUMMARY OF THE INVENTION

It is therefore an object of the present invention to provide a static RAM where a region can be secured for forming a capacitor to be used as a countermeasure against soft errors, where a sufficiently long TFT channel length can be ensured, and where the bit contact reliability is high.

In order to attain this and other objects, according to present invention, there is provided a static RAM which has the following features:

A pattern for a first driver transistor and a pattern for a second driver transistor included in this RAM are therefore arranged so as to be symmetrical about a point with each other. A pattern for a first word transistor and a pattern for a second word transistor are also arranged symmetrically about the point, and a pattern for a first load element and a pattern for a second load element are arranged asymmetrically.

For example, the first and second load elements are thin film transistors, the channel region of the first load element then extends outwardly from the memory cell, and the channel region of the second load element are connected via channel wiring to the memory cell region. A capacitor can also be formed in least one part of the extended channel region.

Also, a bit line is connected to the diffusion layer of one of the word transistors via a wire connected to and overlapping this word transistor and a bit contact formed on this wire.

In the static RAM having the aforementioned structure, by having the patterns for each of the first and second driver transistors and the patterns for each of the first and second word transistors arranged so as to be reciprocally point-symmetrical, and by having the patterns for first and second load elements arranged so as to be asymmetrical, the channel region for, for example, the first TFT, can be extended outwards from the memory cell region. It is also then possible to form a capacitor as a counter measure against, for example, soft errors, on at least one part of the extended channel region.

By connecting a bit line to a diffusion layer for one of the word transistors via a wiring connected to this word transistor and a bit contact part which is formed on this wiring, the aspect ratio for the bit contact part can be reduced.

DETAILED DESCRIPTION OF THE PREFERRED EMBODIMENTS

First Embodiment

Figure 1:
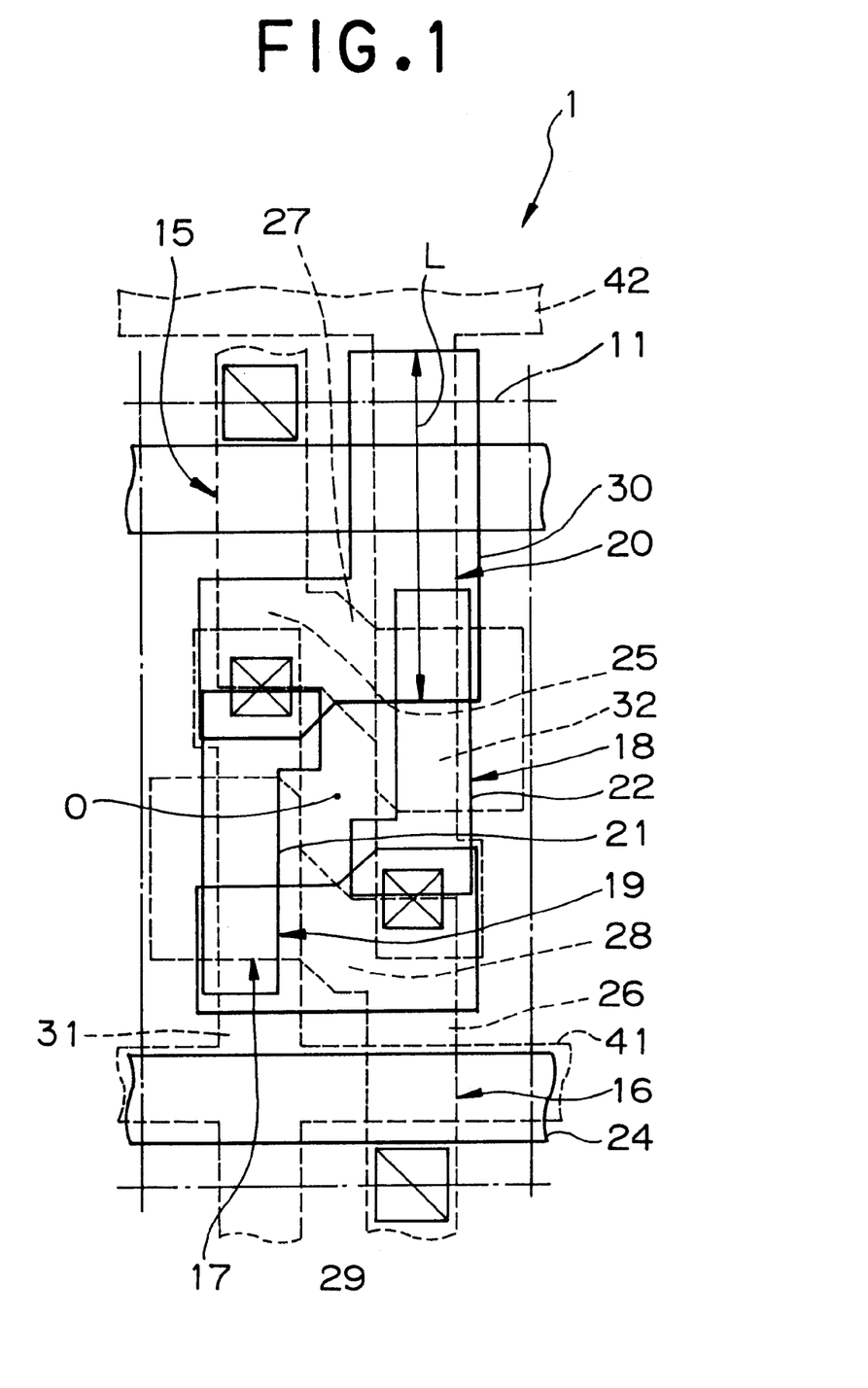
FIG. 1 is a layout diagram for a first embodiment.
Figure 2:
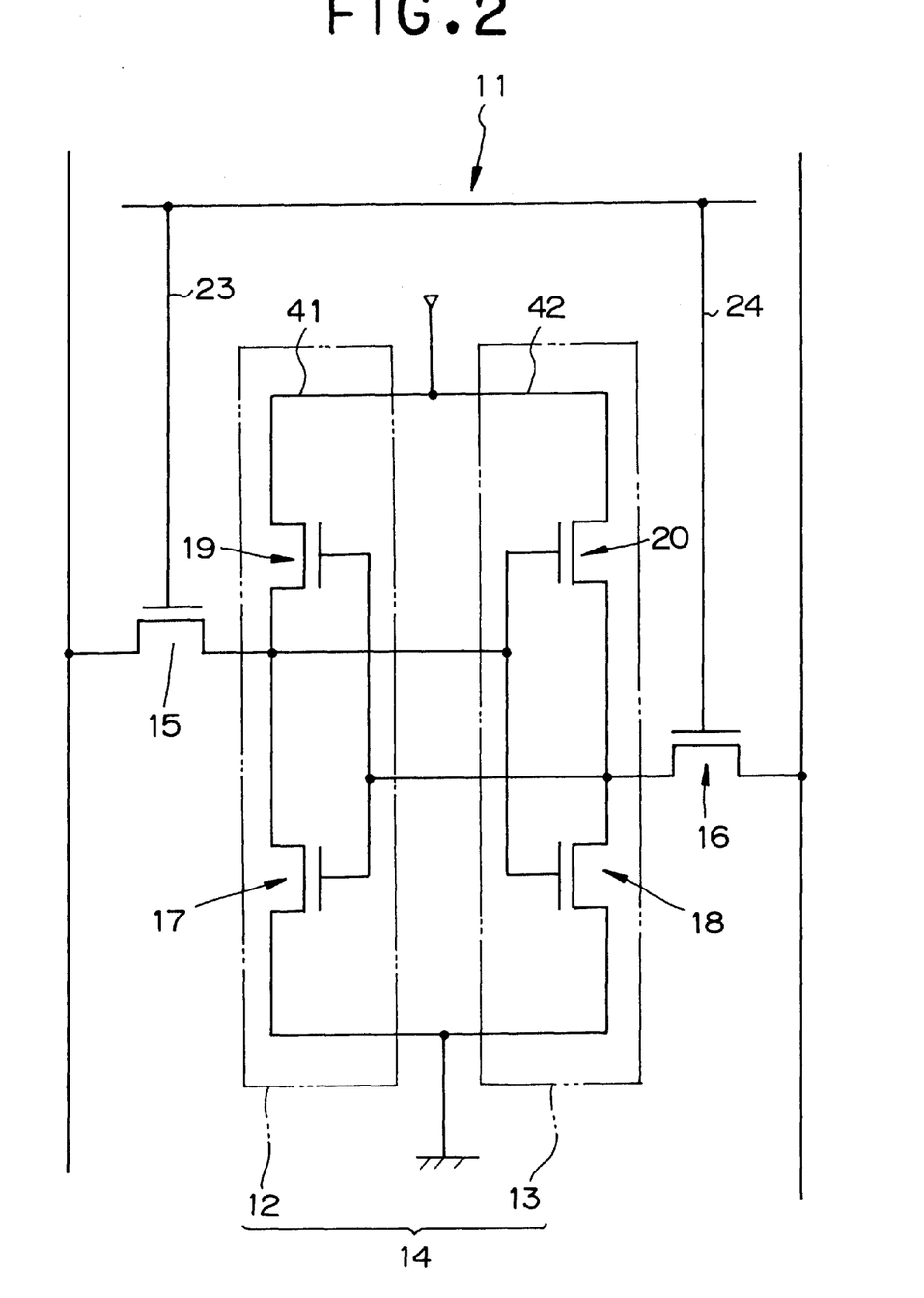
FIG. 2 is a circuit diagram of the first embodiment.

The following is a description of a first embodiment using the layout diagram in FIG. 1 and the circuit diagram in FIG. 2.

As is shown in the diagram, a flip-flop 14 is formed within a memory cell 11 from a first inverter 12 and a second inverter 13. A first word transistor 15 and a second word transistor 16 are then connected to the flip-flop 14.

A gate electrode 21 for a first driver transistor 17 constructed in the first inverter 12 and a gate electrode 22 for a second driver transistor 18 constructed in the second inverter 13 are arranged point symmetrically about a point 0. A word line 23 including the gate electrode for the first word transistor 15 and a word line 24 including the gate electrode for the second word transistor 16 are also arranged symmetrically about the same point 0. In addition to this, diffusion layer regions 25 and 26 for the first and second word transistors 15 and 16 and diffusion layer regions 27 and 28 for the respective first and second driver transistors 17 and 18 which diffusion layer regions 27 and 28 are connected to the regions 25 and 26, respectively, are also arranged symmetrically about the same point 0.

Moreover, a gate terminal 29 for the first load element 19 (as this load element is a TFT, it will herein be referred to as the first TFT) within the first inverter 12 and a gate electrode 30 for the second load element 20 (as this load element is also made from TFT, it will herein be referred to as the second TFT) within the second inverter 13 are also arranged symmetrically about this point 0.

Also, a channel region 31 for the first TFT 19 and a channel region 32 for the second TFT 20 are arranged asymmetrically, i.e. a channel wiring 41. for connecting the channel region 31 is formed within the region for the memory cell 11, and a channel wiring 42 for connecting the channel region 32 is formed outside the region for the memory cell 11, and the channel region 32 is formed so as to be longer than the channel region 31. A power source potential is applied to the channel wiring 41.

Each of the parts of a static RAM 1 are constructed to the layout described above.

The stability of the data retention of the memory cell 11 in the static RAM 1 of the construction described above will therefore become higher as the channel length L for the second TFT 20 has become long.

Second Embodiment

Figure 3:
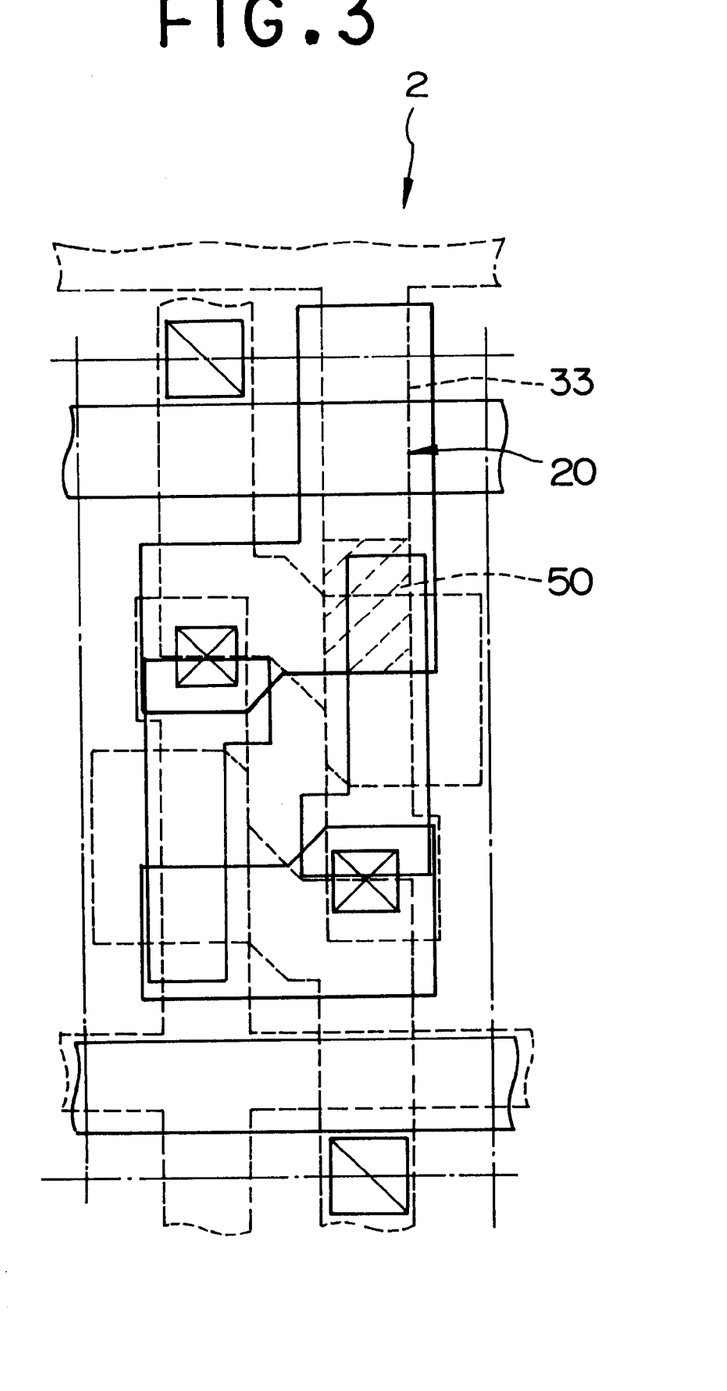
FIG. 3 is a layout diagram for a second embodiment.

Next, a second embodiment will be described with reference to the layout diagram in FIG. 3.

Here, as is shown in this diagram, in a static RAM 2, a capacitor 50 has been formed on at least one part of the extended channel region 33 of the second TFT 20 of the static RAM 1 described above in FIGS. 1 and 2. The capacitor 50 may be formed at this part by forming a region where impurity concentration is made higher than other parts, and by the combination of this part and the gate electrode 30 of the second TFT 20. A description of the construction of the other parts of this embodiment will be omitted as these are the same as for the first embodiment.

In a static RAM 2 having the above structure, the memory capacity of the second TFT 20 is increased by setting up this capacitor 50 on its channel region 33. This strengthens the second TFT's resistance to soft errors.

Third Embodiment

Figure 4:
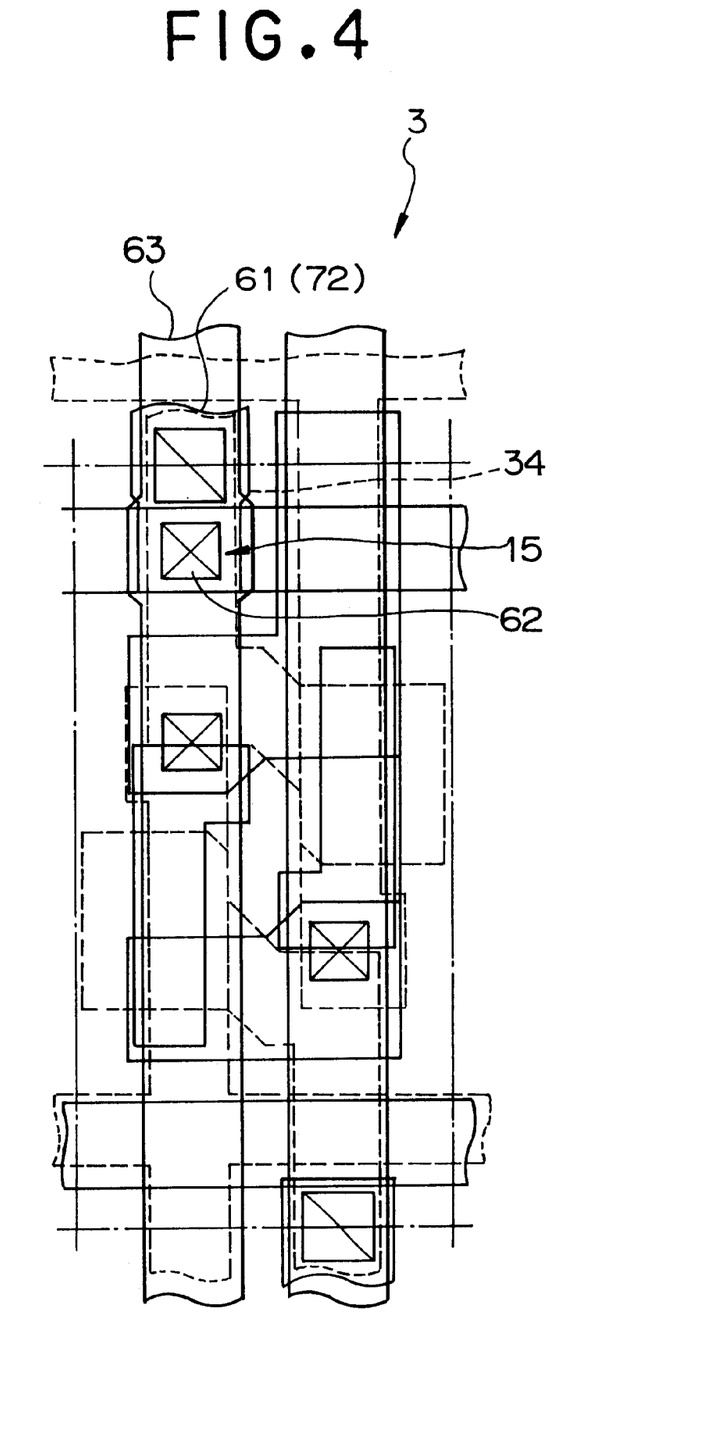
FIG. 4 is a layout diagram for a third embodiment.
Figure 5:
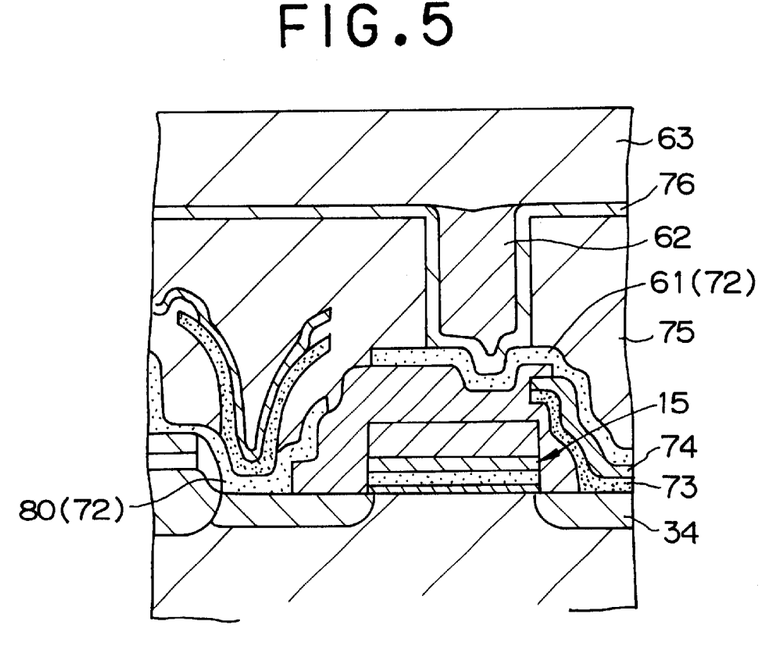
FIG. 5 is a schematic cross-sectional view showing a bit contact part for the third embodiment.

Next, a description will be given with reference to a layout diagram in FIG. 4 and a cross section of the bit contact part in FIG. 5.

With the static RAM 3 shown in this diagram, the position of the bit contact part has been changed from that in the static RAM 1 shown in FIGS. 1 and 2. Taking the first word transistor 15 from the first and second word transistors 15 and 16 as an example, wiring 61 connected to a diffusion layer 34 of the first word transistor 15 is placed on top of the first word transistor 15 via an insulation film 71. This wiring 61 can be formed from, for example, the three layered polysilicon film from which a storage node 80 is made. This three layered polysilicon film can be connected directly to the diffusion layer 34 or can, for example, as is shown in FIG. 5, be connected via a low resistance layer 74 made from, for example, silicide, formed on top of a two-layer polysilicon film 73.

A bit contact part 62 is formed at the inter-layer insulation film 75, and these are set up on the wiring 61. A bit line 63 is then set up in the inter-layer insulation film so as to be in contact with the bit contact part 62. This bit line 63 is therefore connected to the diffusion layer 34 of the first word transistor 15 via the wiring 61 and the bit contact part 62. A barrier metal 76 is also formed on the underside of the bit line 63.

In the static RAM 3 having the above structure, by putting the bit contact part 62 on the first word transistor 15, the aspect ratio of the bit contact part becomes small, and the reliability of the wiring for the bit line 63 is increased.

Figure 6:
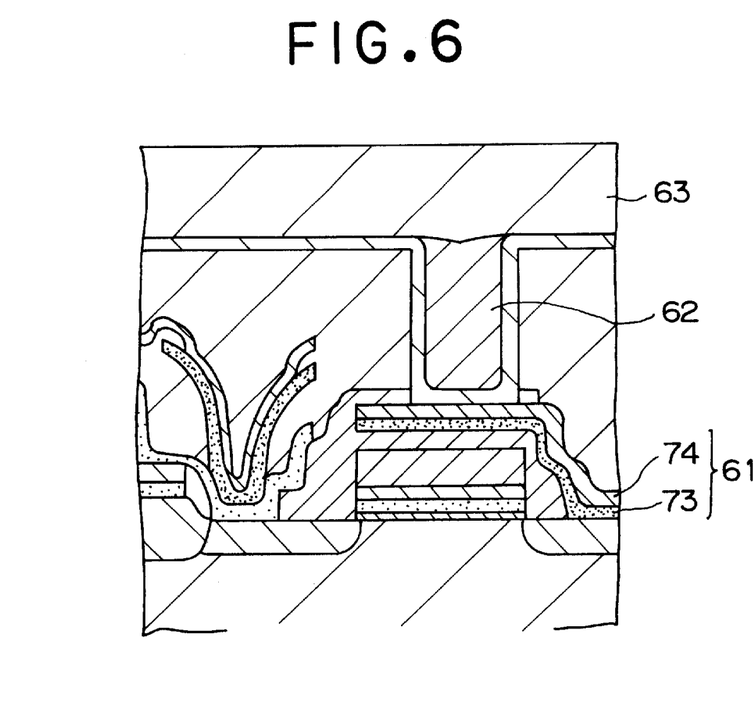
FIG. 6 is a schematic cross-sectional view showing a bit contact part for the third embodiment.

With this kind of static RAM 3, as is shown in the cross section of the bit contact part in FIG. 6, it is also possible to have the wiring 61 formed from, for example, the two layer polysilicon film 73 and the low resistance layer 74, and then connect this to the bit line 63 via the bit contact part 62.

Also, although it is not shown in the diagrams, when the word line and the gate electrode for the driver transistor are not made from the same layers of film (for example, polysilicon film), the word line is formed first, and the wiring is then formed from the film (for example, polysilicon film) from which the gate electrode is formed when the gate electrode is being formed afterwards.

According to the present invention described above, by having the patterns for each of the first and second driver transistors and the patterns for each of the first and second word transistors arranged so as to be reciprocally point-symmetrical, and by having the patterns for first and second load elements arranged so as to be asymmetrical, the channel region for the first TFT can be extended outwards from the memory cell region. As this means that the channel length for the first TFT can be made long, the stability with which data can be retained within the memory cell 11 can be made high. Also, as the channel region has been extended, a capacitor can be formed on it so as to increase the capacity of the first TFT and therefore increase its resistance to soft errors.

Further, by putting wiring connected to the diffusion layer of one of the word transistors, and then forming a bit contact part on this wiring so as to make a connection to a bit line, the aspect ratio of the bit contact part can be made smaller than that for conventional items and the reliability of the bit line wiring can therefore be reduced.

What is claimed is:

1. A unit memory cell of a static RAM comprising:

a flip-flop circuit including first and second inverters, said first inverter including a first driver transistor and a first load element and said second inverter including a second driver transistor and a second load element, first and second word transistors connected respectively to said first and second inverters, wherein a channel pattern for said first driver transistor of said first inverter and a channel pattern for said second driver transistor of said second inverter are symmetrical about a point, a channel pattern for said first word transistor and a channel pattern for said second word transistor are symmetrical about the point;

a channel pattern for said first load element of said first inverter and a channel pattern for said second load element of said second inverter are asymmetrical; and a gate pattern for said first load element is different from a gate pattern for said second load element.

2. The unit memory cell according to claim 1, wherein said first and second load elements comprise first and second thin film transistors, respectively, and said first thin film transistor includes a first channel and a first gate electrode laid over said first channel and said second thin film transistor includes al second channel and a second gate electrode laid over said second channel.

3. The unit memory cell according to claim 2, wherein said first channel extends to a boundary of said unit memory cell.

4. The unit memory cell according to claim 3, further comprising a conductive line electrically connected to said second channel, said conductive line receives a voltage and running across said unit memory cell.

5. The unit memory cell according to claim 3, further comprising a capacitor connected with said gate electrode over a drain region of said first load transistor.

6. The unit memory cell according to claim 1, further comprising an electrode electrically connected to a diffusion region of said first word transistor, said electrode having a contact hole over a word gate electrode of said first word transistor, and a bit line electrically connected to said contact hole.

7. The unit memory of claim 1 wherein:

a channel of said first load transistor is longer in length than a channel of said second load transistor, first and second word transistors connected to said flip-flop circuit, and a gate area of said first load transistor is different from a gate area of said second load transistor.

8. A memory cell of a static RAM comprising:

a flip-flop circuit including first and second inverters, said first inverter including a first driver transistor and a first load transistor, and said second inverter including a second driver transistor and a second load transistor, wherein a channel of said first load transistor is longer in length than a channel of said second load transistor, first and second word transistors connected to said flip-flop circuit, a gate area of said first load transistor is different from a gate area of said second load transistor, and a pattern for said first driver transistor of said first inverter and a pattern for said second driver transistor of said second inverter are symmetrical about a point.

9. The memory cell according to claim 8, wherein a pattern for said first driver transistor of said first inverter and a pattern for said second driver transistor of said first inverter are symmetrical about a point.

10. The unit memory cell of a static RAM according to claim 1 further comprising:

first and second word transistors connected to said flip-flop circuit, and only one voltage pattern line running across said memory cell receiving a voltage, said voltage pattern line connected to said second load element in said unit memory cell.

11. The unit memory cell according to claim 10, wherein said first and second load elements comprise first and second thin film transistors, respectively.

12. The unit memory cell according to claim 11, wherein channel pattern for said first load transistor extends to a boundary line of said unit memory cell.

13. The unit memory cell according to claim 12, wherein said first load transistor comprises a channel, a gate electrode over said channel and a capacitor over a drain region of said first load transistor.

* * * * *